(12) United States Patent
Lin et al.

(10) Patent No.: US 8,517,769 B1
(45) Date of Patent: Aug. 27, 2013

(54) METHODS OF FORMING COPPER-BASED CONDUCTIVE STRUCTURES ON AN INTEGRATED CIRCUIT DEVICE

(75) Inventors: Sean X. Lin, Watervliet, NY (US); Ming He, Slingerlands, NY (US); Xunyuan Zhang, Albany, NY (US); Larry Zhao, Hoeilaart (BE)

(73) Assignee: GlobalFoundries Inc., Grand Cayman (KY)

( * ) Notice: Subject to any disclaimer, the term of this patent is extended or adjusted under 35 U.S.C. 154(b) by 7 days.

(21) Appl. No.: 13/422,295

(22) Filed: Mar. 16, 2012

(51) Int. Cl.
*H01L 21/4763* (2006.01)
*H01L 21/00* (2006.01)

(52) U.S. Cl.
USPC ............ 439/629; 438/583; 257/E21.171; 257/E21.585

(58) Field of Classification Search
USPC ................................ 438/618–757
See application file for complete search history.

(56) References Cited

U.S. PATENT DOCUMENTS

| | | | |
|---|---|---|---|
| 5,674,787 A * | 10/1997 | Zhao et al. | 438/627 |
| 6,077,780 A * | 6/2000 | Dubin | 438/687 |
| 6,168,704 B1 * | 1/2001 | Brown et al. | 205/118 |
| 6,181,013 B1 | 1/2001 | Liu et al. | |
| 6,224,737 B1 | 5/2001 | Tsai et al. | |
| 6,380,084 B1 | 4/2002 | Lim et al. | |
| 6,399,486 B1 | 6/2002 | Chen et al. | |
| 6,492,722 B1 * | 12/2002 | Cheung et al. | 257/700 |
| 6,524,950 B1 | 2/2003 | Lin | |
| 6,630,741 B1 * | 10/2003 | Lopatin et al. | 257/762 |
| 6,642,146 B1 * | 11/2003 | Rozbicki et al. | 438/687 |
| 6,723,653 B1 | 4/2004 | Kim | |
| 7,037,836 B2 * | 5/2006 | Lee | 438/687 |
| 7,071,100 B2 * | 7/2006 | Chen et al. | 438/643 |
| 7,202,168 B2 * | 4/2007 | Ikenoue et al. | 438/687 |
| 7,217,655 B2 | 5/2007 | Cabral, Jr. et al. | |
| 7,282,450 B2 | 10/2007 | Shue et al. | |
| 7,317,253 B2 | 1/2008 | Nogami | |
| 7,432,195 B2 | 10/2008 | Suzuki | |
| 7,514,348 B2 | 4/2009 | Shue et al. | |
| 7,695,981 B2 * | 4/2010 | Dai et al. | 438/1 |
| 7,732,231 B1 | 6/2010 | Aldaz et al. | |
| 7,994,055 B2 * | 8/2011 | Sakai et al. | 438/687 |
| 8,008,184 B2 * | 8/2011 | Matsumoto et al. | 438/618 |
| 2001/0024691 A1 * | 9/2001 | Kimura et al. | 427/346 |
| 2007/0151859 A1 | 7/2007 | Kim | |
| 2008/0223287 A1 * | 9/2008 | Lavoie et al. | 117/94 |
| 2009/0026617 A1 | 1/2009 | Park | |
| 2009/0184421 A1 * | 7/2009 | Oshida et al. | 257/741 |
| 2009/0280649 A1 * | 11/2009 | Mayer et al. | 438/676 |
| 2010/0103634 A1 * | 4/2010 | Funaya et al. | 361/761 |
| 2010/0200991 A1 * | 8/2010 | Akolkar et al. | 257/751 |
| 2010/0285660 A1 | 11/2010 | Lin et al. | |
| 2010/0311238 A1 * | 12/2010 | Nakamura et al. | 438/653 |

(Continued)

*Primary Examiner* — Mohsen Ahmadi
*Assistant Examiner* — Evren Seven
(74) *Attorney, Agent, or Firm* — Williams, Morgan & Amerson, P.C.

(57) ABSTRACT

Disclosed herein are various methods of forming copper-based conductive structures on integrated circuit devices. In one example, the method includes the steps of forming a trench/via in a layer of insulating material, forming a copper-based seed layer above the layer of insulating material and in the trench/via, performing a heating process on the copper-based seed layer to increase an amount of the copper-based seed layer positioned proximate a bottom of the trench/via, performing an etching process on said copper-based seed layer and performing an electroless copper deposition process to fill the trench/via with a copper-based material.

41 Claims, 3 Drawing Sheets

(56) References Cited

U.S. PATENT DOCUMENTS

2011/0124189 A1* 5/2011 Lehr et al. .................... 438/627
2012/0064717 A1  3/2012 Kato et al.
2012/0073865 A1* 3/2012 Kang et al. .................. 174/255
2012/0190188 A1  7/2012 Zhao et al.
2012/0231623 A1* 9/2012 Oshida et al. ................ 438/626
2012/0235302 A1* 9/2012 Furuya ......................... 257/762
2012/0264288 A1* 10/2012 Furuya ........................ 438/627
2013/0026635 A1  1/2013 Yang et al.

* cited by examiner

METHODS OF FORMING COPPER-BASED CONDUCTIVE STRUCTURES ON AN INTEGRATED CIRCUIT DEVICE

BACKGROUND OF THE INVENTION

1. Field of the Invention

Generally, the present disclosure relates to the manufacture of sophisticated semiconductor devices, and, more specifically, to various methods of forming copper-based conductive structures on integrated circuit devices.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Field effect transistors (NMOS and PMOS transistors) represent one important type of circuit element that, to a great extent, substantially determines the performance capability of integrated circuit devices employing such transistors. A field effect transistor, irrespective of whether an NMOS transistor or a PMOS transistor is considered, typically comprises so-called PN junctions that are formed by an interface of highly doped regions, referred to as drain and source regions, with a slightly doped or non-doped region, such as a channel region, disposed between the highly doped source/drain regions.

In a field effect transistor, the conductivity of the channel region, i.e., the drive current capability of the conductive channel, is controlled by a gate electrode formed adjacent to the channel region and separated therefrom by a thin gate insulation layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, the distance between the source and drain regions, which is also referred to as the channel length of the transistor. Thus, in modern ultra-high density integrated circuits, device features, like the channel length, have been steadily decreased in size to enhance the performance of the semiconductor device and the overall functionality of the circuit.

However, the ongoing shrinkage of feature sizes on transistor devices causes certain problems that may at least partially offset the advantages that may be obtained by reduction of the device features. Generally, decreasing the size of, for instance, the channel length of a transistor typically results in higher drive current capabilities and enhanced switching speeds. Upon decreasing channel length, however, the pitch between adjacent transistors likewise decreases, thereby limiting the size of the conductive contact elements—e.g., those elements that provide electrical connection to the transistor, such as contact vias and the like—that may fit within the available real estate between adjacent transistors. Accordingly, the electrical resistance of conductive contact elements becomes a significant issue in the overall transistor design, since the cross-sectional area of these elements is correspondingly decreased. Moreover, the cross-sectional area of the contact vias, together with the characteristics of the materials they comprise, may have a significant influence on the effective electrical resistance and overall performance of these circuit elements.

Thus, improving the functionality and performance capability of various metallization systems has become important in designing modern semiconductor devices. One example of such improvements is the enhanced use of copper metallization systems in integrated circuit devices and the use of so-called "low-k" dielectric materials (materials having a dielectric constant less than 3) in such devices. Copper metallization systems exhibit improved electrical conductivity as compared to, for example, prior art metallization systems using aluminum for the conductive lines and vias. The use of low-k dielectric materials also tends to improve the signal-to-noise ratio (S/N ratio) by reducing crosstalk as compared to other dielectric materials with higher dielectric constants. However, the use of such low-k dielectric materials can be problematic as they tend to be less resistant to metal migration as compared to some other dielectric materials.

Figure 1A:
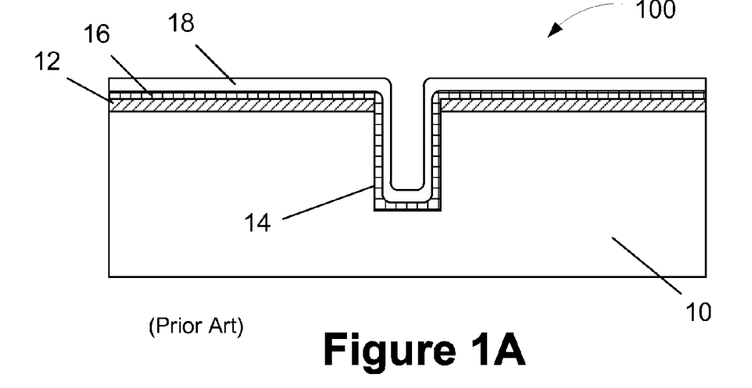
FIGS. 1A-1C depict one illustrative prior art process flow for forming a conductive copper structure by performing an illustrative electroplating process.
Figure 1B:
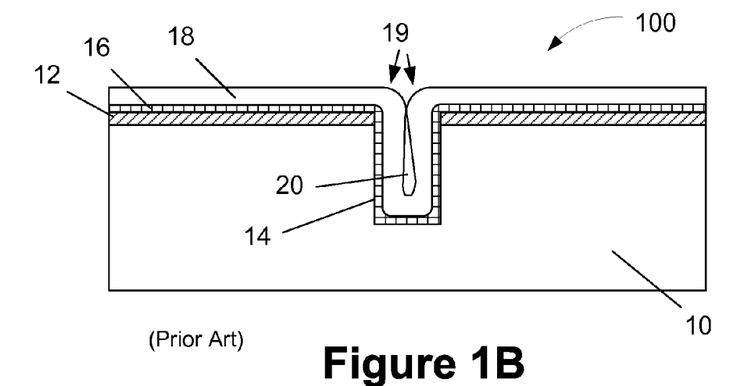
Figure 1C:
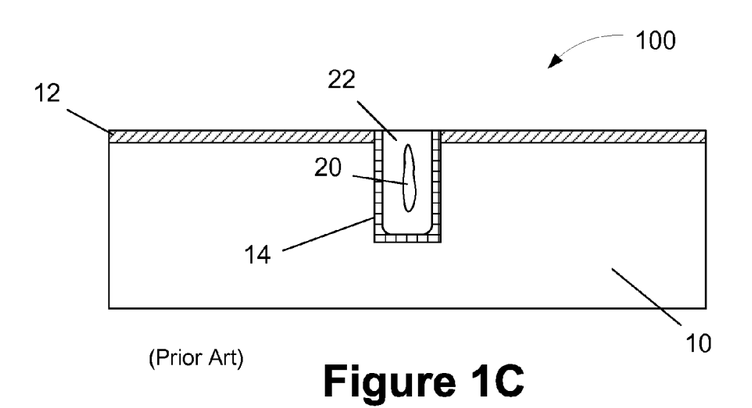

Copper is a material that is difficult to etch using traditional masking and etching techniques. Thus, conductive copper structures, e.g., conductive lines or vias, in modern integrated circuit devices are typically formed using known single or dual damascene techniques. In general, the damascene technique involves: (1) forming a trench/via in a layer of insulating material; (2) depositing one or more relatively thin barrier layers; (3) forming copper material across the substrate and in the trench/via; and (4) performing a chemical mechanical polishing process to remove the excess portions of the copper material and the barrier layer positioned outside of the trench/via to define the final conductive copper structure. The copper material is typically formed by performing an electrochemical copper deposition process after a thin conductive copper seed layer is deposited by physical vapor deposition on the barrier layer FIGS. 1A-1C depict one illustrative example of a problem that may be encountered when conductive copper structures are formed by performing an electroplating process to deposit bulk copper material. As shown in FIG. 1A, a hard mask or polish-stop layer 12 has been formed above a layer of insulating material 10, e.g., silicon dioxide, and a trench/via 14 has been formed in the layer of insulating material 10 by performing known photolithography and etching techniques. A barrier metal layer 16, e.g., tantalum nitride, tantalum or ruthenium, etc., has been deposited across the substrate and in the trench/via 14. Thereafter, a so-called copper seed layer 18 is blanket-deposited across the substrate and in the trench/via 14.

An electroplating process is then performed to deposit an appropriate amount of bulk copper, e.g., a layer of copper, about 500 nm or so thick across the substrate in an attempt to insure that the trench/via 14 is completely filled with copper. In an electroplating process, electrodes (not shown) are coupled to the copper seed layer 18 at the perimeter of the substrate and a current is passed through the copper seed layer 18 which causes copper material to deposit and build on the copper seed layer 18.

FIG. 1B depicts a problem that may be encountered in forming conductive copper structures using an electroplating process. As noted above, as device dimensions have continued to shrink, the size of the conductive structures has also decreased. As a result, the dimensions of the trench/via 14 have become relatively small, making it a challenge to reliably fill such high-aspect ratio openings with very small openings at the top. FIG. 1B depicts the copper seed layer 18 at a relatively early stage of the electroplating process. As the electroplating process proceeds, the copper material may tend to "pinch-off" the trench opening in the areas 19, thereby leading to the formation of an illustrative void 20. At least one reason why this occurs is because the deposition of copper in an electroplating process typically occurs in many directions, i.e., from all copper seed surfaces, although the rate at which copper deposits may be greater on some surfaces—more copper may deposit on the bottom of a trench as compared to the amount of copper deposited on the sidewall of the trench. Thus, formation of copper material on the copper seed layer 18 positioned on the sidewalls of the trench/via 14 tends to contribute, to at least some degree, to the "pinch-off" problem.

FIG. 1C depicts the device 100 after at least one chemical mechanical polishing (CMP) process has been performed to remove excess material positioned outside of the trench/via 14 to thereby define the final conductive copper structure 22 having an illustrative void 20 formed therein. At a minimum, the presence of such voids 20 may increase the resistance of the conductive copper structure 22, may result in increased localized heating, and may reduce the overall operating efficiency of the integrated circuit product. In a worstcase scenario, the conductive copper structure 22 may even completely fail. In addition, the presence of such voids may make the copper structure 22 more susceptible to undesirable electromigration.

There are other problems associated with using an electroplating process to form layers of bulk copper when forming conductive copper structures. For example, as noted above, in an electroplating process, there is typically a relatively large quantity of copper material, e.g., about a 500 nm or so thick layer of copper, that is formed above the substrate in order to insure that the trenches/vias 14 in the layer of insulating material are completely filled. This excess copper material must be removed and it is typically removed by performing a CMP process that is expensive and time consuming to perform. After the copper CMP process is performed, a separate CMP process is typically performed to remove excess amounts of the barrier layer 16 that is positioned outside of the trench/via 14. Achieving planar surfaces on underlying layers of material is very important so as to not adversely impact subsequent processing operations. Performing the copper CMP process to remove such a relatively large amount of bulk copper material can lead to undesirable topography differences across the substrate. Additionally, in an electroplating process, the amount of copper deposited may not be uniform across the substrate. Lastly, to be effective, the electroplating process requires that the copper seed layer 18 uniformly cover the entirety of the wafer. However, as device dimensions have decreased and packing densities have increased, it is becoming more difficult to make the copper seed layer 18 with a uniform thickness in all areas across the substrate due to confined feature spaces.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming copper-based conductive structures on integrated circuit devices. In one example, the method includes the steps of forming a trench/via in a layer of insulating material, forming a copper-based seed layer above the layer of insulating material and in the trench/via, performing a heating process on the copper-based seed layer to increase an amount of the copper-based seed layer positioned proximate a bottom of the trench/via, performing an etching process on the copper-based seed layer and performing an electroless copper deposition process to fill the trench with a copper-based material.

Another illustrative method disclosed herein includes forming a trench/via in a layer of insulating material, forming a barrier liner layer above the layer of insulating material and in the trench/via, forming a copper-based seed layer above the barrier liner layer and in the trench/via, and performing a heating process on the copper-based seed layer to increase an amount of the copper-based seed layer positioned proximate a bottom of the trench/via and to reduce an amount of the copper-based seed layer positioned proximate the sidewalls of the trench/via. This embodiment of the method further includes, after performing the heating process, performing a wet etching process on the copper-based seed layer and performing an electroless copper deposition process to fill the trench with a copper-based material.

Yet another illustrative method disclosed herein includes forming a trench/via in a layer of insulating material, forming a barrier liner layer above the layer of insulating material and in the trench/via, performing a physical vapor deposition process to form a copper-based seed layer on the barrier liner layer and in the trench/via, and performing a heating process on the copper-based seed layer to increase an amount of the copper-based seed layer positioned proximate a bottom of the trench/via and to reduce an amount of the copper-based seed layer positioned on the barrier layer proximate the sidewalls of the trench/via. This embodiment of the method further includes, after performing the heating process, performing a wet etching process on the copper-based seed layer to substantially remove portions of the copper-based seed layer positioned on the barrier layer proximate sidewalls of the trench/via and performing an electroless copper deposition process to fill the trench with a copper-based material.

Yet another illustrative method disclosed herein includes forming a trench/via in a layer of insulating material, forming a barrier liner layer above the layer of insulating material and in the trench/via, performing an electrochemical deposition process to form a copper-based seed layer on the barrier liner layer and in the trench/via, and performing a heating process on the copper-based seed layer to increase an amount of the copper-based seed layer positioned proximate a bottom of the trench/via and to reduce an amount of the copper-based seed layer positioned on the barrier layer proximate the sidewalls of the trench/via. This embodiment of the method further includes, after performing the heating process, performing a wet etching process on the copper-based seed layer to substantially remove portions of the copper-based seed layer positioned on the barrier layer proximate sidewalls of the trench/via and performing an electroless copper deposition process to fill the trench with a copper-based material.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming copper-based conductive structures in any type of trench/via opening on any type of integrated circuit device. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, ASIC's, logic devices, memory devices, etc. With reference to FIGS. 2A-2F, various illustrative embodiments of the methods disclosed herein will now be described in more detail.

Figure 2A:
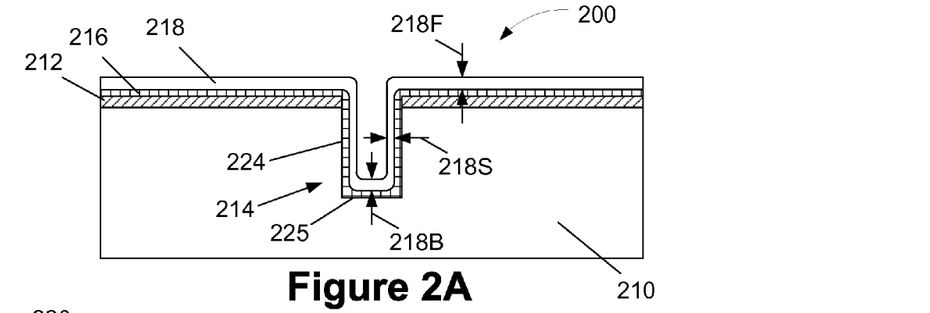
FIGS. 2A-2F depict one illustrative novel process flow for forming conductive copper structures on integrated circuit products, as disclosed herein.

FIG. 2A is a simplified view of an illustrative integrated circuit device 200 at an early stage of manufacturing that is formed above a semiconducting substrate (not shown). The device 200 may be any type of integrated circuit device that employs any type of a conductive copper structure, such as a conductive line or via, commonly found on integrated circuit devices. At the point of fabrication depicted in FIG. 2A, a hard mask or polish-stop layer 212 has been formed above a layer of insulating material 210, and a trench/via 214 has been formed in the layer of insulating material 210 by performing known photolithography and etching techniques. The trench/via 214 is intended to be representative of any type of opening in any type of insulating material wherein a conductive copper structure may be formed. The trench/via 214 may be of any desired shape, depth or configuration. For example, in some embodiments, the trench/via 214 is a classic trench that does not extend to an underlying layer of material, such as the illustrative trench depicted in FIG. 2A. In other embodiments, the trench/via 214 may be a through-hole type feature, e.g., a classic via, that extends all of the way through a layer of insulating material and exposes an underlying layer of material or an underlying conductive structure. Thus, the shape, size, depth or configuration of the trench/via 214 should not be considered to be a limitation of the present invention. With continuing reference to FIG. 2A, a barrier metal liner layer 216, e.g., tantalum nitride, tantalum, ruthenium, etc., has been deposited across the substrate and on the sidewalls 224 and on the bottom 225 of the trench/via 214. Thereafter, a so-called copper-based seed layer 218 has been blanket-deposited across the substrate on the barrier liner layer 216 and in the trench/via 214 proximate the sidewalls 224 and the bottom 225 of the trench/via 214.

The various components and structures of the device 200 may be initially formed using a variety of different materials and by performing a variety of known techniques. For example, the layer of insulating material 210 may be comprised of any type of insulating material, e.g., silicon dioxide, a low-k insulating material (k value less than 3), a high-k insulating material (k value greater than 10), etc., it may be formed to any desired thickness and it may be formed by performing, for example, a chemical vapor deposition (CVD) process or an atomic layer deposition (ALD) process, or plasma-enhanced versions of such processes. The illustrative hard mask layer 212 may be comprised of a variety of materials, such as silicon nitride, titanium nitride, etc. The barrier liner layer 216 may be comprised of a variety of materials, such as, for example, tantalum, tantalum nitride, ruthenium, ruthenium alloys, cobalt, titanium, iridium, etc., and its thickness may vary depending upon the particular application. In some cases, more than one barrier liner layer may be formed in the trench/via 214. The barrier liner layer 216 may be formed by performing a physical vapor deposition (PVD) process, an ALD process, a CVD process or plasma-enhanced versions of such processes. In some applications, ruthenium or a ruthenium alloy may be employed as the barrier liner material because it bonds strongly with copper metal, which may improve the device's electromigration resistance. Cobalt or a cobalt alloy may also be employed as the barrier liner material since it also tends to bond very well with copper metal.

In one illustrative embodiment, the copper-based seed layer 218 may be formed by performing an electrochemical copper or copper alloy deposition process, such as, for example, a PVD process, a CVD process, etc., or by performing an electroless copper or copper alloy deposition process, such as, for example, an electroless deposition (ELD) process, etc. In another illustrative embodiment, where a conductive barrier liner layer 216 such as cobalt, a cobalt alloy, ruthenium or ruthenium alloy are used, a copper plating process may be performed to form the copper-based seed layer 218. In one illustrative embodiment, the copper-based seed layer 218 may have a nominal or target thickness 218F (on substantially horizontal surfaces) of about 30 nm or so while the thickness 218S of the portions of the copper seed layer 218 formed proximate the sidewalls 224 of the trench/via 214 may be about 5-10 nm and the thickness 218B of the copper-based seed layer 218 formed above the bottom 225 of the trench/via 214 may be about 10-20 nm. Of course, the target thickness 218F for the copper-based seed layer 218, as well as the thicknesses 218S and 218B, may vary depending upon the particular application. Importantly, the PVD process may result in more of the copper-based seed material forming above the bottom 225 of the trench/via 214 than on the barrier liner layer 216 proximate the sidewalls 224 of the trench/via 214. The copper-based seed layer 218 may be comprised of pure copper, or a copper alloy, including, for example, copper-aluminum, copper-cobalt, copper-manganese, copper-magnesium, copper-tin and copper-titanium, with alloy concentrations ranging from 0.1 atomic percent to about 50 atomic percent based on application.

Figure 2B:
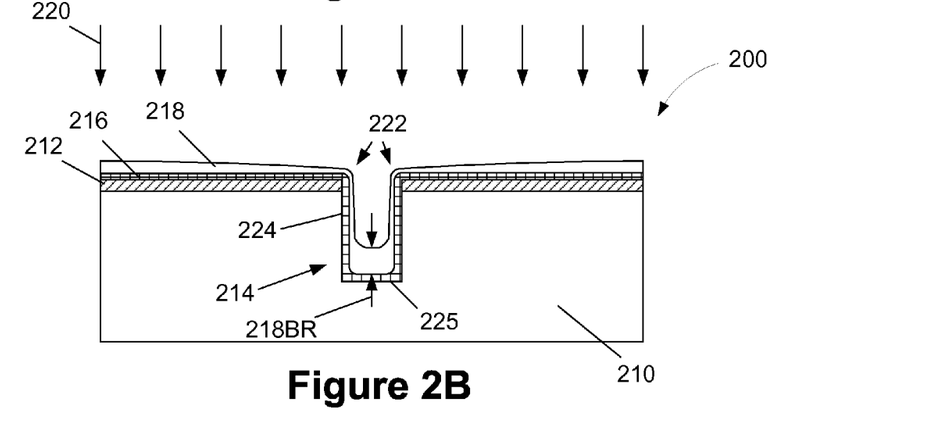

Next, as shown in FIG. 2B, a heating or reflow process 220 is performed on the device 200. In one illustrative embodiment, the heating process 220 may be performed at a temperature of about 100-350° C. for a duration of about 5-120 seconds. In general, the heating process 220 causes more of the copper-based seed layer 218 to diffuse toward the bottom 225 of the trench/via 214 while reducing the amount of the copper-based seed layer 218 positioned above the barrier liner layer 216 proximate the sidewalls 224 of the trench/via 214 and in the areas 222 near the opening of the trench/via 214. For example, in one illustrative embodiment, after the heating process 220 is performed, the thickness 218BR of the copper-based seed material positioned above the bottom 225 of the trench 214 may be increased to about 20-40 nm, while the thickness of the copper-based seed layer 218 positioned above the barrier liner layer 216 proximate the sidewalls 224 may be reduced to about 2-3 nm and the thickness of the copper-based seed layer 218 in the areas 222 near the opening of the trench/via 214 may be reduced to about 5-10 nm. In general, the thickness of the copper-based seed layer 218 in areas remote from the opening of the trench/via 214 may remain effectively unchanged due to the heating process 220. Of course, the various thicknesses for the copper-based seed layer 218 at various locations may change depending upon the particular application. The heating process 220 may be performed in the same process chamber that is employed to form the copper-based seed layer 218, in a different process chamber, e.g., a de-gas chamber of a multi-chamber processing tool, or it may be performed in a completely separate tool, e.g., an RTA chamber or a furnace. FIG. 2F is a picture of a device wherein the heating process 220 was performed on a copper seed layer that was formed by a PVD process. The numbers in FIG. 2F reflect the thickness of the copper seed layer material at various locations after the heating process was performed.

Figure 2C:
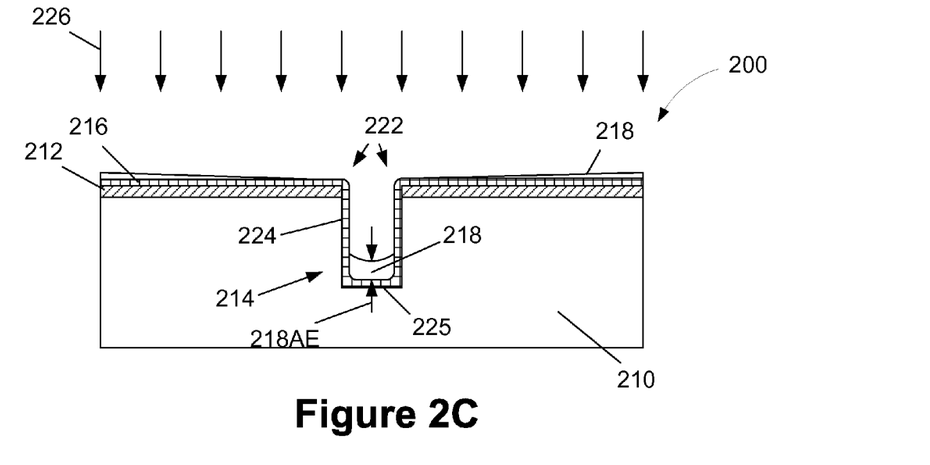

Then as shown in FIG. 2C, an etching process 226 is performed on the copper-based seed layer 218. In one illustrative embodiment, the etching process 226 may be a wet etching process using hydrochloric acid and peroxide as the etchant material. The etching process 226 removes substantially all of the copper-based seed layer 218 that is positioned above the barrier liner layer 216 proximate the sidewalls 224 of the trench/via 214 and from the areas 222 near the opening of the trench/via 214 where the thickness of the copper-based seed layer 218 was reduced during the heating process 220. The etching process 226 also removes some of the copper-based seed material that is positioned above the bottom of the trench/via 214, but due to the extra thickness 218BR (FIG. 2B) of copper-based seed material at that location, the etching process 226 does not remove all of the copper-based seed layer 218 from above the bottom 225 of the trench/via 214. For example, in one illustrative embodiment, the thickness 218AE of the copper-based seed material 218 above the bottom 225 of the trench/via 214 after the etching process 226 has been performed may be about 10-20 nm. In the illustrative example depicted in FIG. 2C, there may be remaining portions of the copper-based seed layer 218 above the hard mask layer 212 in areas remote from the opening of the trench/via 214. To the extent these remaining portions are present, the thickness of the remaining portions of the copper-based seed layer 218 in those remote areas will also be reduced during the etching process 226. Importantly, the etching process 226 substantially clears the copper-based seed material from above the portions of the barrier liner layer 216 that are positioned proximate the sidewalls 224 of the trench/via 214 and from the areas 222 near the opening of the trench/via 224, thereby leaving the copper-based seed material substantially only in the area above the bottom 225 of the trench/via 214.

In some embodiments, after the etching process 226 is performed, one or more process operations may be performed to eliminate oxide materials, such as ruthenium oxide material, that may have formed on the barrier liner layer 216. For example, a heating process at a temperature of at least about 100° C. may be performed on the device for a duration of about 30 seconds in a reducing atmosphere, such as, for example, a hydrogen-containing gas, such as a forming gas, to reduce such oxide materials. In another example, the device may be placed in a wet bath that includes reducing chemical ingredients, e.g., a bath comprising DMAB (dimethylamine-borane), to reduce any such oxide materials on the barrier liner layer 216. When the barrier liner layer 216 is made of cobalt or cobalt alloy, this heating or chemical treatment to remove or reduce oxides may or may not be needed because cobalt oxides may be dissolved in electroless copper bath, depending on the chemistry and process parameters.

Figure 2D:
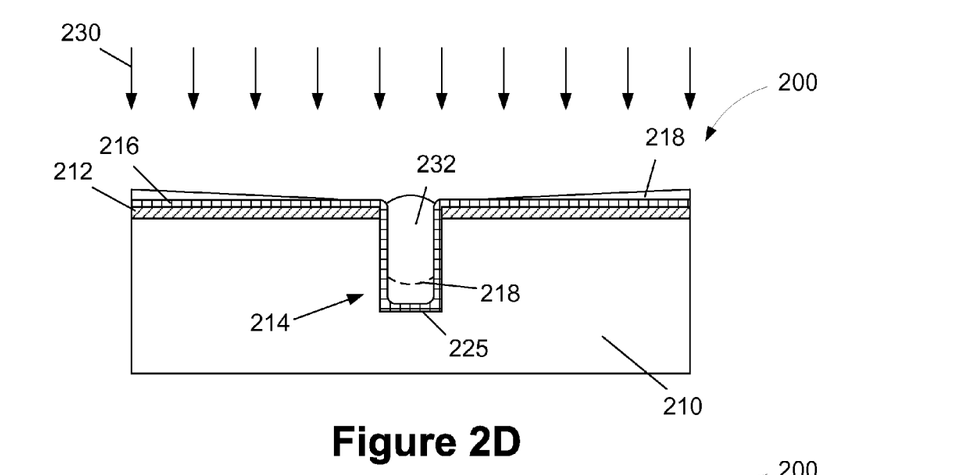

Next, as shown in FIG. 2D, an electroless deposition process 230 is performed to fill the trench/via 214 with copper-based material 232 using the copper-based seed material 218 (shown with a dashed line in FIG. 2D) that is positioned above the bottom 225 of the trench/via 214 as the seed material for the electroless deposition process 230. The electroless deposition process 230 will only initiate the formation of copper material in regions where the copper-based seed layer 218 is remaining, i.e., it will not initiate copper formation on the exposed portions of the barrier liner layer 216. The copper-based material 232 formed during this process may be comprised of pure copper, or a copper alloy, such as those identified above with respect to the copper-based seed layer 218. Thus, the formation of the copper-based material 232 within the trench/via 214 will proceed in a substantially single direction, i.e., from the bottom 225 of the trench/via 214 upwards. This substantially single-direction fill process tends to reduce the chances of "pinching-off" in any portion of the trench/via 214, as described with respect to the prior art electroplating processes set forth in the background section of this application. Importantly, the methods disclosed herein may be used to at least reduce, and perhaps eliminate, the formation of voids in conductive copper-based structures. To the extent that there are remaining portions of the copper-based seed layer 218 above the hard mask layer 212 in areas remote from the trench/via 214, the thickness of the copper-based seed layer 218 in those remote areas will also increase during the electroless deposition process 230.

Figure 2E:
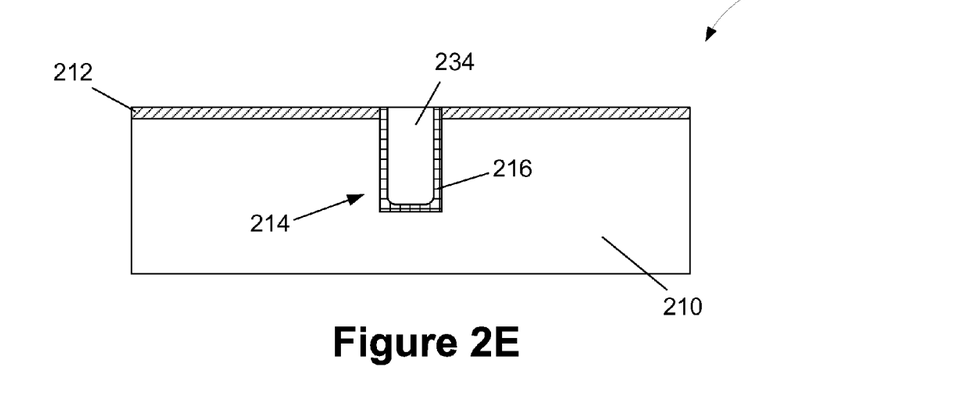
Figure 2F:
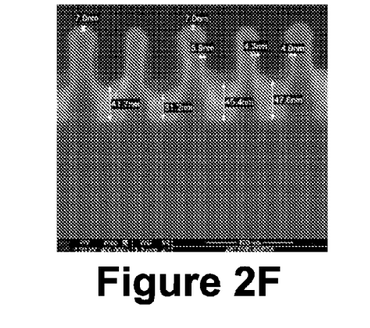

Next, as shown in FIG. 2E, the device 200 is subjected to an anneal process to, among other things, increase the grain size of the resulting conductive copper-based structure 234 and improve the bonding between the copper-based structure 234 and the barrier liner layer 216, i.e., the copper wettable metal layer. A CMP process may then be performed on the device 200 to remove excess portions of copper material and the barrier liner layer 216 positioned outside of the trench/via 214. Note that, using the novel process disclosed herein, the large quantity of copper material that is typically associated with a traditional electroplating process is not present.

Accordingly, a single CMP process may be performed to remove the relatively small amount of copper-based material and the barrier liner layer 216 from the device.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a device, comprising:
    forming a trench/via in a layer of insulating material;
    forming a copper-based seed layer above said layer of insulating material in said trench/via;
    performing a heating process on said copper-based seed layer to increase an amount of said copper-based seed layer positioned proximate a bottom of said trench/via;
    after performing said heating process, performing an etching process on said copper-based seed layer; and
    at some point after performing said etching process, performing an electroless deposition process to fill said trench/via with a copper-based material.

2. The method of claim 1, wherein forming said copper-based seed layer comprises performing one of a physical vapor deposition process or a chemical vapor deposition process.

3. The method of claim 1, wherein forming said copper-based seed layer comprises performing an electrochemical deposition process and wherein said copper-based seed layer comprises copper or a copper alloy.

4. The method of claim 1, wherein forming said copper-based seed layer comprises performing an electroless deposition process and wherein said copper-based seed layer comprises copper or a copper alloy.

5. The method of claim 1, wherein performing said heating process comprises performing a heating process at a temperature of about 100-350° C. for a duration of about 5-120 seconds.

6. The method of claim 1, wherein performing said etching process on said copper-based seed layer comprises performing a wet etching process.

7. The method of claim 1, wherein performing said etching process on said copper-based seed layer comprises performing a wet etching process to substantially remove portions of said copper-based seed layer positioned above said sidewalls of said trench/via.

8. The method of claim 7, wherein performing said wet etching process removes substantially all of said copper-based seed layer positioned above said layer of insulating material proximate an opening of said trench/via.

9. The method of claim 7, wherein performing said etching process on said copper-based seed layer leaves a residual portion of said copper-based seed layer positioned proximate a bottom of said trench/via.

10. The method of claim 1, further comprising:
    after performing said etching process, performing another heating process on said device at a temperature of at least about 100° C. in a reducing atmosphere; and
    after performing said another heating process, performing said electroless deposition process.

11. The method of claim 10, wherein said reducing atmosphere comprises a hydrogen-containing gas.

12. The method of claim 11, wherein said hydrogen-containing gas is a forming gas.

13. The method of claim 1, further comprising:
    after performing said etching process, positioning said device in a wet bath that contains reducing chemical ingredients; and
    removing said device from said bath and thereafter performing said electroless deposition process.

14. The method of claim 1, wherein, prior to forming said copper-based seed layer, the method further comprises forming a barrier liner layer above said layer of insulating material and in said trench/via and wherein forming said copper-based seed layer comprises forming said copper-based seed layer on said barrier liner layer in said trench/via.

15. The method of claim 14, wherein said barrier liner layer is comprised of one of cobalt, a cobalt alloy, ruthenium or a ruthenium alloy.

16. A method of forming a device, comprising:
    forming a trench/via in a layer of insulating material, said trench/via having sidewalls;
    forming a barrier liner layer above said layer of insulating material and in said trench/via;
    forming a copper-based seed layer above said barrier liner layer and in said trench/via;
    performing a heating process on said copper-based seed layer to increase an amount of said copper-based seed layer positioned proximate a bottom of said trench/via and to reduce an amount of said copper-based seed layer positioned proximate said sidewalls of said trench/via;
    after performing said heating process, performing a wet etching process on said copper-based seed layer; and
    at some point after performing said etching process, performing an electroless deposition process to fill said trench/via with a copper-based material.

17. The method of claim 16, wherein forming said copper-based seed layer comprises performing one of a physical vapor deposition process or a chemical vapor deposition process.

18. The method of claim 16, wherein forming said copper-based seed layer comprises performing an electrochemical deposition process and wherein said copper-based seed layer comprises copper or a copper alloy.

19. The method of claim 16, wherein forming said copper-based seed layer comprises performing an electroless deposition process and wherein said copper-based seed layer comprises copper or a copper alloy.

20. The method of claim 16, wherein performing said heating process comprises performing a heating process at a temperature of about 100-350° C. for a duration of about 5-120 seconds.

21. The method of claim 16, wherein performing said wet etching process removes substantially all of said copper-based seed layer positioned above said barrier liner layer proximate the sidewalls of said trench/via.

22. The method of claim 21, wherein performing said wet etching process removes substantially all of said copper-based seed layer positioned above said barrier liner layer proximate an opening of said trench/via.

23. The method of claim 21, wherein performing said etching process on said copper-based seed layer leaves a residual portion of said copper-based seed layer positioned proximate a bottom of said trench/via.

24. The method of claim 16, further comprising:
after performing said wet etching process, performing another heating process on said device at a temperature of at least about 100° C. in a reducing atmosphere; and
after performing said another heating process, performing said electroless deposition process.

25. The method of claim 24, wherein said reducing atmosphere is a hydrogen-containing gas.

26. The method of claim 25, wherein said hydrogen-containing gas is a forming gas.

27. The method of claim 16, further comprising:
after performing said wet etching process, positioning said device in a wet bath that contains reducing chemical ingredients; and
removing said device from said bath and thereafter performing said electroless deposition process.

28. A method of forming a device, comprising:
forming a trench/via in a layer of insulating material, said trench/via having sidewalls;
forming a barrier liner layer above said layer of insulating material in said trench/via;
performing a physical vapor deposition process to form a copper-based seed layer on said barrier layer in at least said trench/via;
performing a heating process on said copper-based seed layer to increase an amount of said copper-based seed layer positioned proximate a bottom of said trench/via and to reduce an amount of said copper-based seed layer positioned on said barrier layer proximate said sidewalls of said trench/via;
after performing said heating process, performing a wet etching process on said copper-based seed layer to substantially remove portions of said copper-based seed layer positioned on said barrier layer proximate sidewalls of said trench/via; and
at some point after performing said wet etching process, performing an electroless deposition process to fill said trench/via with a copper-based material.

29. The method of claim 28, wherein performing said wet etching process removes substantially all of said copper-based seed layer positioned above said barrier liner layer proximate the sidewalls of said trench/via.

30. The method of claim 28, wherein performing said etching process on said copper-based seed layer leaves a residual portion of said copper-based seed layer positioned proximate a bottom of said trench/via.

31. The method of claim 28, wherein performing said heating process comprises performing a heating process at a temperature of about 100-350° C. for a duration of about 5-120 seconds.

32. The method of claim 28 further comprising:
after performing said wet etching process, performing another heating process on said device at a temperature of at least about 100° C. in a reducing atmosphere; and
after performing said another heating process, performing said electroless deposition process.

33. The method of claim 28, further comprising:
after performing said wet etching process, positioning said device in a wet bath that contains reducing chemical ingredients; and
removing said device from said bath and thereafter performing said electroless deposition process.

34. A method of forming a device, comprising:
forming a trench/via in a layer of insulating material, said trench/via having sidewalls;
forming a barrier liner layer above said layer of insulating material in said trench/via;
performing a physical vapor deposition process to form a copper seed layer on said barrier liner layer in at least said trench/via;
performing a heating process on said copper seed layer to increase an amount of said copper seed layer positioned proximate a bottom of said trench/via and to reduce an amount of said copper seed layer positioned on said barrier layer proximate said sidewalls of said trench/via, wherein said heating process is performed at a temperature of about 100-350 C;
after performing said heating process, performing a wet etching process on said copper seed layer to substantially remove portions of said copper seed layer positioned on said barrier layer proximate said sidewalls of said trench/via and leave a residual portion of said copper-based seed layer positioned proximate a bottom of said trench/via; and
at some point after performing said wet etching process, performing an electroless copper deposition process to fill said trench with copper.

35. The method of claim 34, wherein said heating process that is performed on said copper-based seed layer is performed for a duration of about 5-120 seconds.

36. The method of claim 34, further comprising:
after performing said wet etching process, performing another heating process on said device at a temperature of at least about 100° C. in a reducing atmosphere; and
after performing said another heating process, performing said electroless deposition process.

37. The method of claim 34, further comprising:
after performing said wet etching process, positioning said device in a wet bath that contains reducing chemical ingredients; and
removing said device from said bath and thereafter performing said electroless deposition process.

38. A method of forming a device, comprising:
forming a trench/via in a layer of insulating material, said trench/via having sidewalls;
forming a barrier liner layer above said layer of insulating material in said trench/via;
performing an electrochemical deposition process to form a copper seed layer on said barrier liner layer in at least said trench/via;
performing a heating process on said copper seed layer to increase an amount of said copper seed layer positioned proximate a bottom of said trench/via and to reduce an amount of said copper seed layer positioned on said barrier layer proximate said sidewalls of said trench/via, wherein said heating process is performed at a temperature of about 100-350 C;
after performing said heating process, performing a wet etching process on said copper seed layer to substantially remove portions of said copper seed layer positioned on said barrier layer proximate said sidewalls of said trench/via and leave a residual portion of said copper-based seed layer positioned proximate a bottom of said trench/via; and
at some point after performing said wet etching process, performing an electroless copper deposition process to fill said trench with copper.

39. The method of claim 38, wherein said heating process that is performed on said copper-based seed layer is performed for a duration of about 5-120 seconds.

40. The method of claim 38, further comprising:
after performing said wet etching process, performing another heating process on said device at a temperature of at least about 100° C. in a reducing atmosphere; and after performing said another heating process, performing said electroless deposition process.

41. The method of claim 38, further comprising:

after performing said wet etching process, positioning said device in a wet bath that contains reducing chemical ingredients; and removing said device from said bath and thereafter performing said electroless deposition process.

* * * * *